United States Patent [19]

Nelson et al.

[11] Patent Number: 4,734,387
[45] Date of Patent: Mar. 29, 1988

[54] GROWTH OF SEMICONDUCTORS ON A SHAPED SEMICONDUCTOR SUBSTRATE

[75] Inventors: Andrew W. Nelson; Leslie D. Westbrook, both of Felixstowe, England

[73] Assignee: British Telecommunications plc, United Kingdom

[21] Appl. No.: 770,081

[22] Filed: Aug. 28, 1985

Related U.S. Application Data

[63] Continuation-in-part of Ser. No. 851,314, Apr. 9, 1986, abandoned, which is a continuation of Ser. No. 571,277, Jan. 16, 1984, abandoned.

[30] Foreign Application Priority Data

Jan. 19, 1983 [GB] United Kingdom ................ 8301350
May 24, 1983 [GB] United Kingdom ................ 8314376

[51] Int. Cl.$^4$ .............................................. B05D 5/12
[52] U.S. Cl. ...................................... 437/234; 156/613
[58] Field of Search ............................ 427/87; 156/613

[56] References Cited

U.S. PATENT DOCUMENTS 4,116,733  9/1978  Olson ................................. 156/613
4,227,962  10/1980  Antypas ............................... 427/87
4,250,205  2/1981  Constant .............................. 427/87

FOREIGN PATENT DOCUMENTS 0052979  6/1982  European Pat. Off. ............. 427/87
2015982  9/1979  United Kingdom .

OTHER PUBLICATIONS

Chang et al. "Characterization of GaAs Expitaxial Layers . . . " Journal of Crystal Growth, 55, No. 1, Oct. 1981, pp. 24–29.
Duchemin et al. "Organometallic Growth of Device Quality InP by Cracking of in $(C_2H_5)_3$ and $PH_3$ at Low Pressure Inst. Phys. Conf. Ser. No. 45: chapter 1, pp. 10–18, 1979.
"Hybrid LPE/MBE-Grown InGaAsP/InP DFB Lasers", Asahi, H. et al., Electronics Lett. Jul. 7, 1983, vol. 19, No. 14, pp. 507–509.
Prevention of Surface Corrugation Thermal Deformation for InGaAs P/InP DFB Lasers", Nagai, H., et., Japanese Journal of Applied Physics, vol. 22, No. 5, May 1983, pp. L291–L293.
Y. Uematsu, H. Okuda, and J. Kinoshita, "Room-Temperature CW Operation of 1–3 $\mu$m Distributed-Feedback GaInAsP/InP Lasers", Electronics Letters, 18, 857–858 (1982).
Z. L. Liau and J. N. Walpole, "A Novel Technique for GaInAsP/InP Buried Heterostructure Laser Fabrication", Appln. Phys. Letter, vol. 40, pp. 568–570 (Apr. 1, 1982).
L. D. Westbrook, A. W. Nelson, and C. Dix, "High--Quality InP Surface Corrugations for 1.55 $\mu$m InGaAsP DFB Lasers Fabricated Using Electron-Beam Lithography", Electronic Letters, vol. 18, pp. 863–865 (Sep. 1982).
T. Matsuoka, H. Nagai, Y. Itaka, Y. Noguchi, Y. Suzuki and T. Ikegami, Electronics Letters, vol. 18, pp. 27–28 (Jan. 7, 1982).

(List continued on next page.)

Primary Examiner—Michael R. Lusignan
Assistant Examiner—M. L. Padgett
Attorney, Agent, or Firm—Nixon & Vanderhye

[57] ABSTRACT

A gas mixture containing phosphine and $R_1R_2R_3$ In X $R_4R_5R_6$ or $R_1R_2$In X $R_4R_5$ where the Rs are alkyl groups is passed over a semiconductor substrate comprising indium and phosphorus so as to deposit a semiconductor material comprising indium and phosphorus, and the exposure of the substrate to phosphine is controlled to avoid or reduce transport of the substrate material.

Thus, for example, indium phosphide may be grown onto corrugations in gallium indium arsenide phosphide, the corrugations being non-deformed during this growth. Such a growth step may be used in the production of distributed feedback semiconductor lasers operating near 1.55 $\mu$m.

50 Claims, 11 Drawing Figures

OTHER PUBLICATIONS

Semiconductor Lasers", Govind, P. et al., Appl. Phys. Lett. 46 (3), Feb. 2, 1985, pp. 213-215.

"A Novel gaInAsP/InP Distributed Feedback Laser", Liau, Z. L. et al., Appl. Phys. Lett. 46(3), Feb. 1, 1985, pp. 221-223.

"1.55 Micrometer InGaAsP Ridge Waveguide Distributed Feedback Laser", Temkin, H. et al., Appl. Phys. Lett. 45 (1), Dec. 1, 1984.

"Hologranic Photelectrochemical Etching for Diffraction Gratings in N-InP and N-GaInAsP for Distributed Feedback Lasers", Lum, R. M. et al., J. Appl. Phys. 57 (1), Jan. 1, 1985, pp. 39-44.

"Fabrication, Characterization, and Analysis of Mass-Transported GaInAsP/InP Buried-Heterostructure Lasers," Liau, Z. L. et al., IEEE Journal of Quant. Electron, vol. QE-20, No. 8, Aug. 1984, pp. 855-865.

"CW Operation of 1.57-Micrometer $Ga_{-x}In_{1-x}As_yP_{1-y}$InP Distributed Feedback Lasers Grown by Low-Pressure Metalorganic Chemical Vapor Deposition", Razeghi, M. et al., Appl. Phys. Lett. 45 (7), Oct. 1, 1984, pp. 784-786.

"Deformation of V-Grooves on InP Substrate by Heat Treatment", Tanashi, T., et al., Journal of Crystal Growth 64 (Oct. 1983).

"Reproducable Liquid Phase Epitaxial Growth on Surface Corrugation for 1.3 Micrometer GaInAsP/InP Distributed Feedback Lasers", Uematsu, Y., et al., Extended Abstracts of the 15th Conference on Solid State Devices and Materials, Tokyo, 1983, pp. 301-304.

Kawanishi et al., "GaAs/AIGaAs Distributed Feedback-Transverse Junction Strip Laser..." 931 Journal K. Sakai, K. Utaka, S. Akiba, and Y. Matsushima " 1.5 $\mu$m Range InGaA sp/InP Distributed Feedback Lasers", IEEE J. Quantum Electronics, QE-18, No. 8, pp. 1272-1278, Aug. 1982.

R. H. Moss and J. S. Evans, "A New Approach to MOCBD of Indium Phosphide and Gallium-Indium Arsenide", J. Crystal Growth 55, pp. 129-134 (Oct. 1981).

"Low-Threshold Distribution Feedback Lasers Fabricated on Material Grown Completely by LP-MOCVD", Razaghi, M, et al., IEEE Journal of Quantium Electronics, vol. QE-21, No. 6, Jun. 1985, pp. 507-511.

"Improvements in the Modulation Amplitude of Submicron Gratings Produced in N-InP by Direct Photoelectrochemical Etching," Lum, R. M. et al., Appl. Phys. Lett. 47 (3), Aug. 1, 1985, pp. 269-271.

"Low-Threshold Operation of 1.54 Micrometer InGaaAP/InP DFB Laser with Second-Order Grating", Wakao, K. et al., Electronics Lett., Apr. 11, 1985, vol. 21, No. 8, pp. 321-322.

"Low Pressure Metalorganic Vapor Phase Epitaxy of inP in a Vertical Reactor", Mamoru, O. and Kuroiwa, K., J. Electrochem. Soc.: Solid-State Science and Technology, May 1985, pp. 1209-1214.

"Polarization Characteristics of Distributed Feedback of Applied Physics, vol. 52 (Jul. 1981), No. 7, New York USA.

Kazuo Sakai, "1.5 m Range InGaAsP/InP Distributed Feedback Lasers" 8106 IEEE Journal of Quantum Electronics, vol. QE-18, Aug. 1982, No. 8, New York, USA.

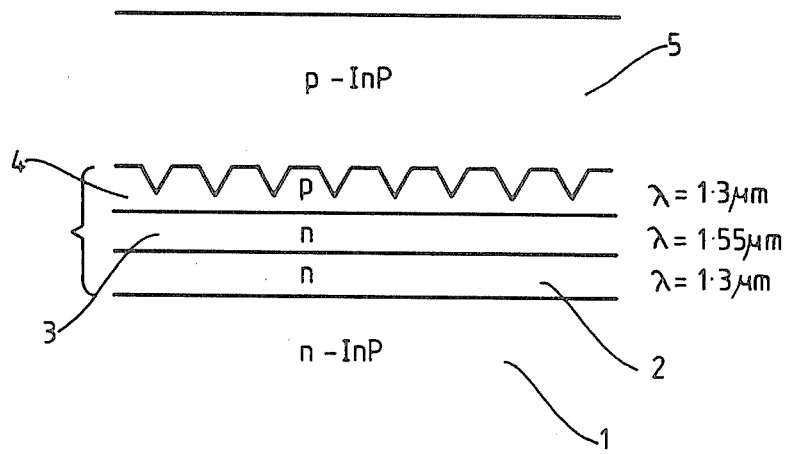
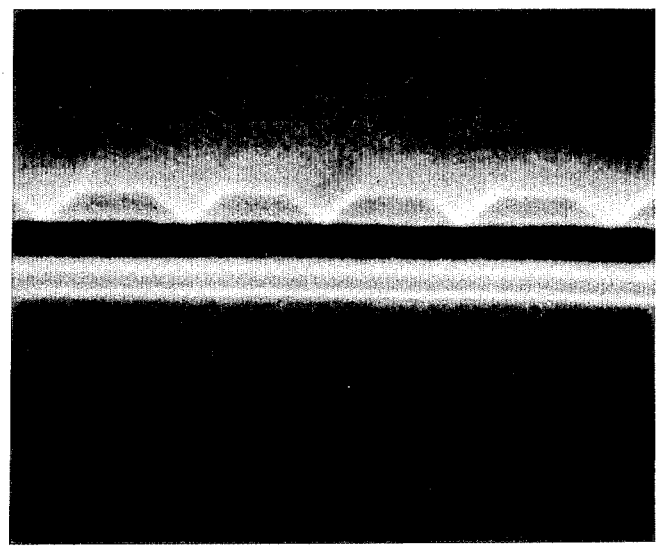

GROWTH OF SEMICONDUCTORS ON A SHAPED SEMICONDUCTOR SUBSTRATE

CROSS REFERENCE TO RELATED APPLICATION

This is a continuation-in-part application of our abandon parent application Ser. No. 851,314, filed Apr. 9, 1986 (an FWC of Ser. No. 571,277 filed Jan. 16, 1984, now abandon).

FIELD OF THE INVENTION

The present application relates to the growth of semiconductors. More particularly, the invention relates to the growth of semiconductor materials containing indium and phosphorus.

BACKGROUND OF THE INVENTION

Semiconductor materials containing indium and phosphorus are important, for example, in the fabrication of semiconductor lasers for operation at wavelengths in the infra-red, especially near to 1.3 and 1.55 $\mu$m, at which wavelengths silica optical fibres usually have loss minima, the minimum at 1.55 $\mu$m being the deeper one. Operation near these wavelengths is extremely attractive for telecommunication purposes.

Both for telecommunications and other purposes it is often desirable that the laser power should be concentrated into a very narrow frequency range. In the case of telecommunications systems with silica fibres, this is especially important for operation near 1.55 $\mu$m where the materials dispersion in the fibre is usually much greater than near 1.3 $\mu$m.

In one of the simplest semiconductor laser designs (the Fabry-Perot type), the laser usually operates, undesirably for such purposes, in a plurality of longitudinal modes of differing wavelength. In addition, the precise wavelengths of the modes depend on the dimensions of the laser cavity and this restricts one's freedom to use such lasers in integrated optics structures (since in these structures the effective dimensions of the laser cavity are a function of the other devices in the integrated structure).

Longitudinal mode control can be achieved by means of a diffraction grating. One laser structure incorporating a diffraction grating is known as the distributed feedback (DFB) laser (see G. H. B. Thompson, Semiconductor Lasers, Wiley, 1980). A DFB laser operating at 1.53 $\mu$m has been described by K. Sakai, K. Utaka, S. Akiba, and Y. Matsushima (IEEE J. Quantum Electronics, QE-18, no. 8, pages 1272-1278, August 1982). In constructing their laser they made a first order diffraction grating with a period of 2365 Å (0.2365 $\mu$m) on the surface of doped InP by holographic techniques and chemical etching. The corrugation depth thus achieved was typically 1000 Å (0.1 $\mu$m), but the subsequent growth of a doped quaternary layer (i.e., a layer containing Ga, In, As and P plus dopant) reduced the corrugation depth of 200-500 Å (0.02-0.05 $\mu$m). They attributed this to dissolution of the grating in the melt used for growing the quaternary layer. (This technique of growth is known as liquid phase epitaxy of LPE).

The final depth of the DFB corrugations is one of the most important parameters of the device. The reduction of the corrugation depth in LPE has an adverse effect on laser efficiency and in particular raises the threshold current of the laser. High threshold currents make for heating of the laser in use and consequent control difficulties and for low upper working temperatures.

In general, one can say that the spectral purity and threshold current of the DFB lasers are strongly dependent on the precise positioning and cross-section profile of the integral diffraction grating, and that close control of the manufacturing processes incorporating these sub-micron period corrugations into the laser structure is highly desirable.

SUMMARY OF THE INVENTION

An object of the present invention is to provide a more satisfactory method of growing semiconductor layers comprising indium and phosphorus on shaped surfaces, especially diffraction gratings.

The method of growth to be employed according to the present invention is a modification of the known metal organic chemical vapour deposition (MOCVD) technique for semiconductor materials comprising indium and phosphorus, as known for example from R. H. Moss and J. S. Evans, J. Crystal Growth, 55, pages 129-134 (1981) and from European patent application published number 52 979, published June 2, 1982, the disclosures of which are incorporated herein by this reference.

The present invention provides a method of depositing on the surface of a semiconductor substrate comprising indium and phosphorus a semiconductor material comprising indium and phosphorus, in which method the semiconductor material is growth from a gas mixture containing phosphine and a compound of the general formula (I) or (II)

$$R_1R_2R_3InXR_4R_5R_6 \qquad (I)$$

$$R_1R_2InXR_4R_5 \qquad (II)$$

in which $R_1$ to $R_6$ are alkyl groups, any two of which may be the same or different, and X is an atom which has an $s^2p^3$ outer electron configuration, characterized in that the exposure of the substrate to phosphine is controlled to avoid to reduce transport of the substrate material.

For the avoidance of any possible doubt, it is now stated that the elements X are the same elements as are referred to as group V in the aforesaid European patent application. N and P are preferred.

As will be apparent from the aforesaid prior art, the stability of the compound of general formula (I) is such as to avoid substantially the reaction between $R_1R_2R_3In$ and $PH_3$ to produce polymers such as $[-In(CH_3)-PH-]_n$ at normal temperatures.

Usually, the compositions of the semiconductor substrate and the grown semiconductor material will differ.

Advantageously, the surface of the substrate is a shaped one, deformation of the shape of the surface being avoided or reduced insofar as said material transport is avoided or reduced. Corrugated surfaces and especially diffraction gratings are shaped surfaces to which the method of the present invention may be applied.

The diffraction gratings are most especially those in DFB lasers for operation near to 1.3 $\mu$m or 1.55 $\mu$m. The stable emission wavelengths and narrow spectral linewidths of these lasers make them of interest in respect of high bit rate, long haul fibre links, wavelength multiplexing, and coherent communications systems. In addition, DFB lasers can be employed in integrated circuits containing both electronic and optoelectronic components since cleaved mirrors are not essential to their operation.

However, it is to be understood that lasers of other operating wavelengths could be constructed in accordance with the invention (e.g., from 1.1 to 1.65 μm) and that other shaped structures could be overgrown by the method of the invention (e.g., gratings in Bragg lasers and structures in devices other than lasers).

The control of exposure to phosphine in accordance with the invention is based on the principle that phosphine tends to cause material transport and deformation of shaped surfaces at temperatures similar to those required for the growth but that once a surface has been protected by growth such transport and deformation will not occur. Typically one would avoid exposing an unprotected surface to phosphine at temperatures above 550° C. for more than one minute and preferably the exposure time would be less than this especially where temperatures in excess of 630° C. are used for growth.

One method of control involves the provision of the gas mixture containing phosphine and the compound of general formula (I) or (II) about the substrate at a temperature below that at which material transport would occur and the rapid heating of the substrate in the gas mixture to a suitable growth temperature.

This procedure contrasts strongly with the prior art MOCVD technique referred to above, where phosphine is admitted at low temperature and the compound of general formula (I) or (II) is admitted only at the growth temperature. Moreover, a procedure in which the compound of general formula (I) or (II) is admitted at low temperature might have been expected (on the basis of the considerations set out or implied by the prior art) to lead to deposition of indium metal and/or formation of polymers such as the trimethylindium/phosphine polymer $[-In(CH_3)PH-]_n$ and/or nonepitaxial growth during warm-up.

A second method of control involves the provision of phosphine about the substrate at temperatures below that at which material transport would occur, rapid raising of the substrate to the growth temperature, and admission of the compound of general formula (I) or (II) very shortly after the growth temperature is achieved, typically within 20 seconds. We have found that delay leads to very significant alteration of the substrate surface.

The man skilled in the art will be able to devise further control procedures based on the principal set out above.

It is envisaged that a principal application of the present invention will be to the growth of InP onto a substrate $In_xGa_{1-x}As_yP_{1-y}$ or of $In_xGa_{1-x}As_yP_{1-y}$ onto a substrate InP, the two compounds (the grown material and the substrate) being lattice matched so that epitaxial growth is possible. The former application is especially advantageous since the quaternary compound is less susceptible to thermal dissociation that InP, having a lower proportion of phosphorus.

The reader is referred to the above-mentioned prior art on MOCVD for details of the growth itself. It is, however, convenient to note the following points here:

(i) Among the suitable compounds of the general formulae (I) and (II) are $(CH_3)_3InP(CH_3)_3$, $(CH_3)_3InP(C_2H_5)_3$, $(CH_3)_3InN(C_2H_5)_3$, and $(CH_3)_2InN(C_2H_5)_2$.

(ii) We have observed that the P or N in these compounds do not in practice contribute significantly to the deposited semiconductor material, the reactions in growth being, for instance,

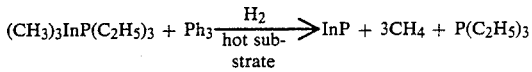

(iii) Compounds of general formula (I) may, according to convenience, be prepared to advance and volatilized for use or else formed from $R_1R_2R_3In$ and $XR_4R_5R_6$ in the gas phase immediately prior to use, e.g., in the line leading to the reactor in the experimental arrangement shown in the paper of Moss and Evans. Compounds of general formula (II) would normally be prepared in advance and volatilized.

(iv) Suitable sources for Ga in the deposited material include $(CH_3)_3Ga$ and its adducts with compounds of the general formula $XR_4R_5R_6$.

(v) A suitable source of As in the deposited material is arsine.

(vi) To achieve the desired electronic properties, the deposited material will normally be doped with small quantities of further elements. Thus, for example, one may dope InP or a quaternary material with zinc by the use of $(CH_3)_2Zn$ during the growth process.

(vii) Growth temperatures in the range from 600° C. to 700° C. are preferred for good epitaxy.

BRIEF DESCRIPTION OF THE DRAWINGS

The present invention will now be illustrated with reference to the following Examples and the accompanying FIGS. 1 to 4 and 8 to 11 of which FIG. 1 is a schematic cross-sectional view of a product, the last layer of which is grown in accordance with the present invention and as described in the Examples 1 and 2, which product (as described in Example 3) can be used for the fabrication of a DFB laser;

FIG. 4 is an SEM photograph of the corrugations after the overgrowth of Example 2;

DETAILED DESCRIPTION

Example 1

Figure 2:
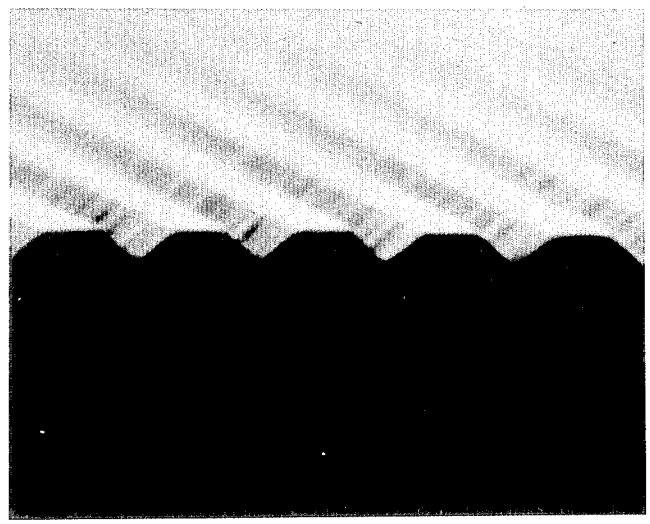
FIG. 2 is a scanning electron microscope (SEM) photograph of DFB corrugations before overgrowth in accordance with the invention as described in Examples 1 and 2.

This Example describes the production of a structure appropriate in its general scheme to a DFB laser operating at 1.55 μm.

The (100) face of Sn-doped n-InP (1 in FIG. 1) was used as the substrate for the growth, by conventional two-phase LPE at 663° C. in a graphite boat, of a three-layer quaternary structure, shown bracketed in the Figure. The epitaxy was carried out in the automated furnace described in A. W. Nelson, L. D. Westbrook, and E. A. D. White, J. Cryst. Growth, volume 58, pages 236-242 (1982). Pre-cast melts were used so as to achieve consistency of both the epitaxial layer thickness and crystal compositions.

The first of the three layers grown (2 in FIG. 1) comprised of Te-doped indium gallium arsenide phosphide layer. This layer was n-type with a band gap as determined by photoluminescence equivalent to a wavelength of 1.3 $\mu$m. The second layer, 3, comprised an Sn-doped indium gallium arsenide phosphide (n-type) with a band gap equivalent of 1.55 $\mu$m. The third layer, 4, comprised a Zn-doped indium gallium arsenide phosphide layer with a band gap equivalent of 1.3 $\mu$m. The approximate thicknesses of the layers are, respectively, 0.15 $\mu$m, 0.15 $\mu$m and 0.2 $\mu$m.

Second order DFB corrugations having a period of 0.46 $\mu$m were then formed in layer 4 in the $<1\bar{1}0>$ direction by electron beam lithography by the method described in L. D. Westbrook, A. W. Nelson and C. Dix, Electronic Letters, volume 18, pages 863-865 (September 1982), the contents of which are incorporated herein by this reference. The composition of layer 4 was $In_{0.74}Ga_{0.26}As_{0.57}P_{0.43}$. The etchant used for making the corrugations was 10 weight percent iodic acid. The corrugated surface thus formed was cleaned with concentrated hydrofluoric acid for 5 minutes and washed with pure water. The $<1\bar{1}0>$ orientation of the corrugations means that the etching process is self-limiting, and the observed resultant was a grating comprising triangular-shaped grooves approximately 1600 Å (0.16 $\mu$m) deep. Fourier analysis of such a profile shows that it contains a second harmonic component (of 0.23 $\mu$m period)—this being the component responsible for DFB action—with a peak-to-peak amplitude (i.e., depth) of 666 Å (0.0666 $\mu$m).

With the structure at about 100° C. to prevent condensation, the following gases were passed, at slightly above atmospheric pressure, as a mixture into the reaction zone of the MOCVD apparatus:

500 cm$^3$/min measured at 20° C. of a $PH_3/H_2$ mixture containing 5 volume percent of $PH_3$ (i.e., 25 cm$^3$/min $PH_3$).

25 cm$^3$/min of $H_2$ measured at 20° C. saturated with $(C_2H_5)_3P$ at 13.5° C.

25 cm$^3$/min of $H_2$ measured at 20° C. saturated with $(CH_3)_3In$ at 50° C.

100 cm$^3$/min measured at 20° C. of a mixture of $(CH_3)_2Zn$ and $H_2$ containing 0.1 volume percent of $(CH_3)_2Zn$ (i.e., 0.1 cm$^3$/min of $(CH_3)_2Zn$.

4000 cm$^3$/min of additional $H_2$ measured at 20° C. After 1 to 2 minutes flushing time, the sample was RF-heated to 650° C. in 40 seconds and held at 650° C. for one hour, during which growth of Zn-doped p-type InP occurred as layer 5. The $(CH_3)_3In$ and $(C_2H_5)_3P$ flows were then stopped and the other flows maintained. The heating was switched off and the sample temperature fell to 450° C. in about 1 minute, reaching 50° C. after about a further 4 minutes. The $Ph_3/H_2$ and $(CH_3)_2Zn/H_2$ flows were switched off, and finally the $H_2$ flow shortly before unloading of the structure from the furnace. (For safety, unloading was performed under $N_2$.)

This hybrid LPE/MOCVD approach to the structure as a whole has the attraction that it combines the present superior quality quaternary material produced by LPE with the near-isotropic growth properties of the MOCVD technique, MOCVD InP nucleation being relatively insensitive to the varying surface orientation presented by the DFB grating. It should be noted that tolerances on crystal epitaxy are much more severe for DFB lasers than in Fabry-Perot lasers because the lasing wavelength—which is controlled by the layer thicknesses and refractive indices together with the grating period—needs to be closely matched to the peak gain wavelength for low threshold operation.

The electron-beam lithography technique used for the production of the gratings has the advantage of being highly flexible. For example, gratings of different periods and of varying orientations may be written on the same wafer in a single exposure, under computer control. The mark/space ratio of the grating mask may also be varied to produce the optimum amount of any particular Fourier component in the final grating cross-section (see Westbrook et al, Electronics Letters, volume 18, pages 863-5 (1982) already referred to).

It is believed also that the positioning of the corrugations in the top waveguide layer of quaternary material having a band gap equivalent 1.3 $\mu$m is substantially advantageous over positioning them in the InP lowest layer as described for example in Sakai et al (already referred to), in T. Matsuoka, H. Nagai, Y. Itaka, Y. Noguchi, Y. Suzuki and T. Ikegami, Electronics Letters, volume 18, pages 27-28 (1982), and in Y. Uematsu, H. Okuda, and J. Kinoshita, Electronics Letters, 18, 857-858 (1982). The low concentration of P in the quaternary layer compared with InP makes thermal dissociation during the overgrowth process less favourable, and therefore makes for a further reduction of the damage done to the corrugations. Further, it is in practice much easier to obtain precise positioning of the corrugations relative to the active layer so as to maximize DFB coupling.

Figure 3:
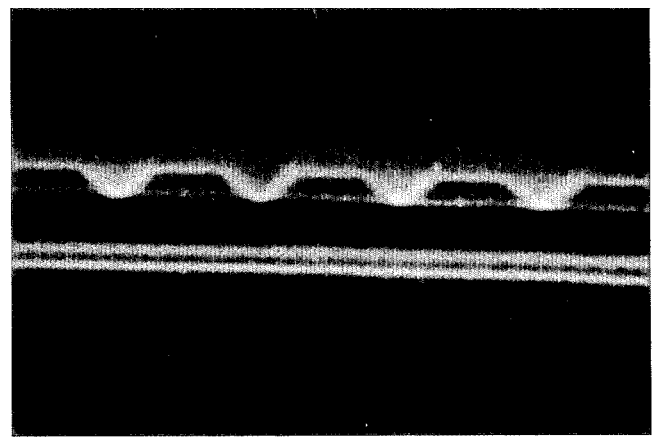
FIG. 3 is an SEM photograph of the corrugations after the overgrowth in Example 1.

FIGS. 2 and 3 show that virtually no surface deformation occurred during the MOCVD overgrowth step. The final depth of the corrugations was practically unchanged at approximately 1600 Å (0.16 $\mu$m).

Example 2

In this Example, the overgrowth was on a similar substrate to that of Example 1 and the flow rates used were identical. However, the growth temperature was only 575° C. (achieved in less than 40 seconds) and the reagents other than $PH_3$ and $H_2$ were introduced only after the growth temperature had been achieved. These other reagents were introduced within 10 seconds of the growth temperature being achieved.

It will be seen from FIG. 4 that no deformation of the corrugations occurred. However, the growth morphology was inferior to that achieved in Example 1.

Example 3

In this Example, a DFB laser was fabricated and tested.

First, a structure as shown in FIG. 1 was once more grown. The compositions of materials 1 to 5 in FIG. 1 were essentially the same as in Example 1, with the exception that the n-type InP substrate 1 was S-doped, not Sn-doped. The thickness of layers 1 to 4 and the dimensions of the corrugations in layer 4 were also the same. The thickness of the substrate 1 was approximately 200 μm. The thickness of layer 5 was about 3 μm. Layers 2 to 4 were grown by LPE also as described in Example 1. Layer 5 was grown by MOCVD as in Example 1 except that the flow rate of the $(CH_3)_2$ $Zn/H_2$ mixture was 3 cm$^3$/min for 50 minutes and 100 cm$^3$/min for the last 10 minutes. This provided a good electrical contact at the top of layer 5 but avoided excessive diffusion of zinc into the "active" layer 3.

The purpose of the choices of compositions and layer thicknesses was to provide in the eventual laser efficient interaction between the stimulated emission and the DFB grating whilst still maintaining effective carrier confinement.

Then the base of the InP substrate 1 was metallized with an alloy of gold and tin, and oxide-isolated stripe contacts of a gold-zinc alloy were formed on the surface of layer 5. These stripes were 15 μm wide and extended in a direction perpendicular to the grooves of the grating.

Then the product was separated into DFB lasers. This was done so that an individual laser was 200 μm long with a longitudinal metal stripe on the top surface, with the side facets (i.e., the faces running in the same direction as the stripe) scribed, with the one end facet scribed, and with the other end facet cleaved. The purpose of the scribing was to suppress Fabry-Perot modes.

In the laser, layers 2 and 4 (of band gap equivalent 1.3 μm) functioned as buffer layers to isolate the active layer 3 (of band gap equivalent 1.55 μm) from non-radiative recombination sites which exist at both the substrate and the DFB-corrugation hetero-interfaces. (A hetero-interface in this case is an interface between InP and quaternary material.) The laser emits light via the cleaved facet already referred to.

Figure 9:
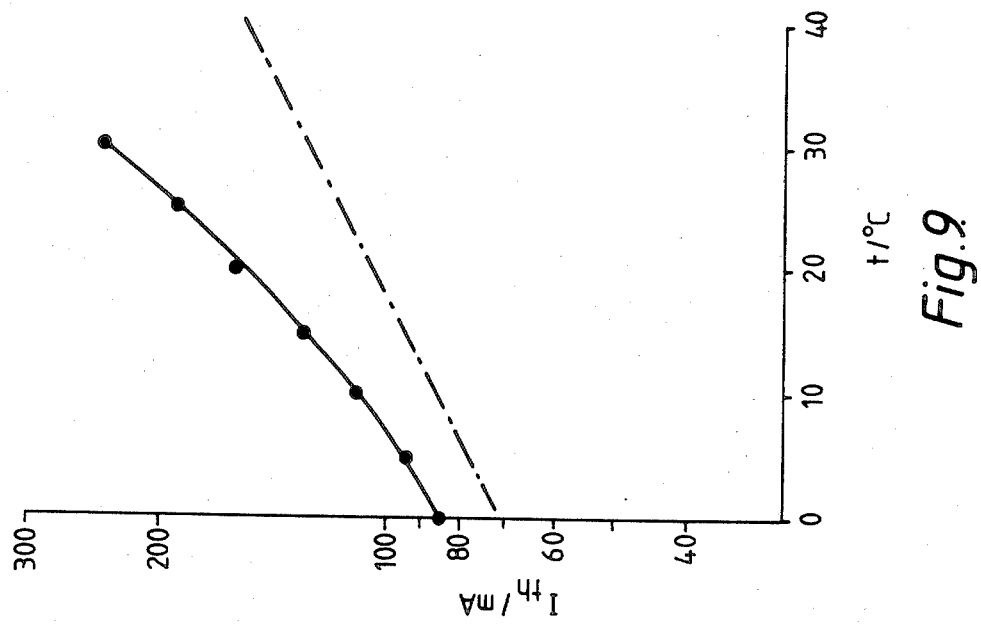
FIG. 9 is a plot of threshold current against temperature for the DFB laser.
Figure 8:
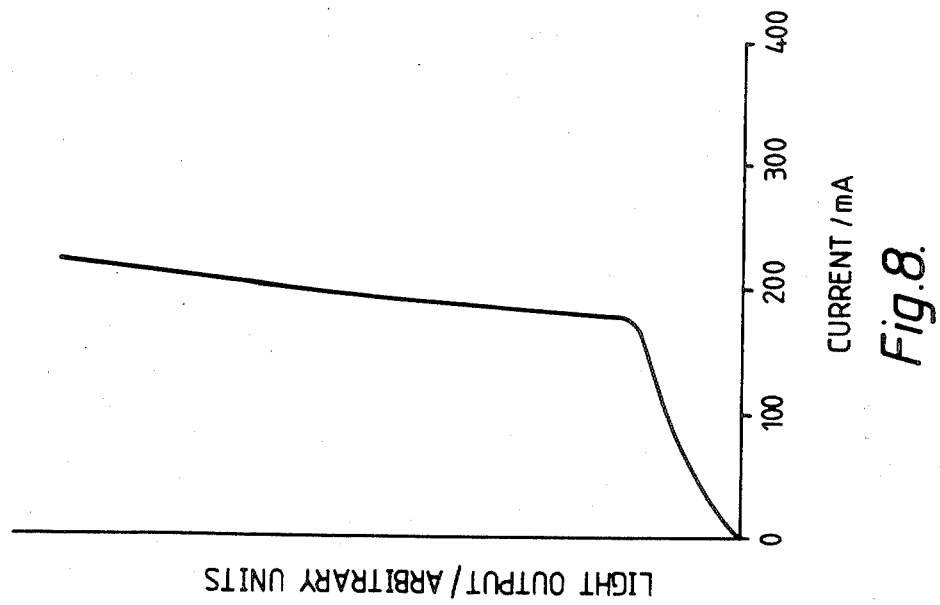
FIG. 8 is a plot of light output against current for the DFB laser of Example 3 at 23° C.

The relationship of light output to current was determined for one of the DFB lasers at 23° C. with the use of 100 ns current pulses at a repetition frequency of 100 Hz. The results are shown in FIG. 8. The threshold current at this temperature was observed to be 170 mA. The variation of threshold current, $I_{th}$, with Celsius temperature, t, is shown in FIG. 9 over the range of t from 0° to 30° C. The observed temperature sensitivity is believed to be due in part to varying mismatch between the peak-gain and peak-emission wavelengths.

The plot of FIG. 9 may be compared with the empirical relationship $$I_{th}(t) = I_{th}(t=0° C.) \exp(t/50° C.)$$

observed for 1.5 μm Fabry-Perot lasers by R E Nahory, M A Pollock, and J C DeWinter, Electronics Letters, volume 15, pages 695-696 (1979). In FIG. 9, the above equation gives rise to a family of straight lines parallel to the broken line indicated. It is seen that the slope of these lines is similar to the slope of the plot for the DFB laser at 0° C. This may possibly indicate that the peak gain and emission wavelengths of the DFB laser are approximately coincident at this temperature.

Figure 11:
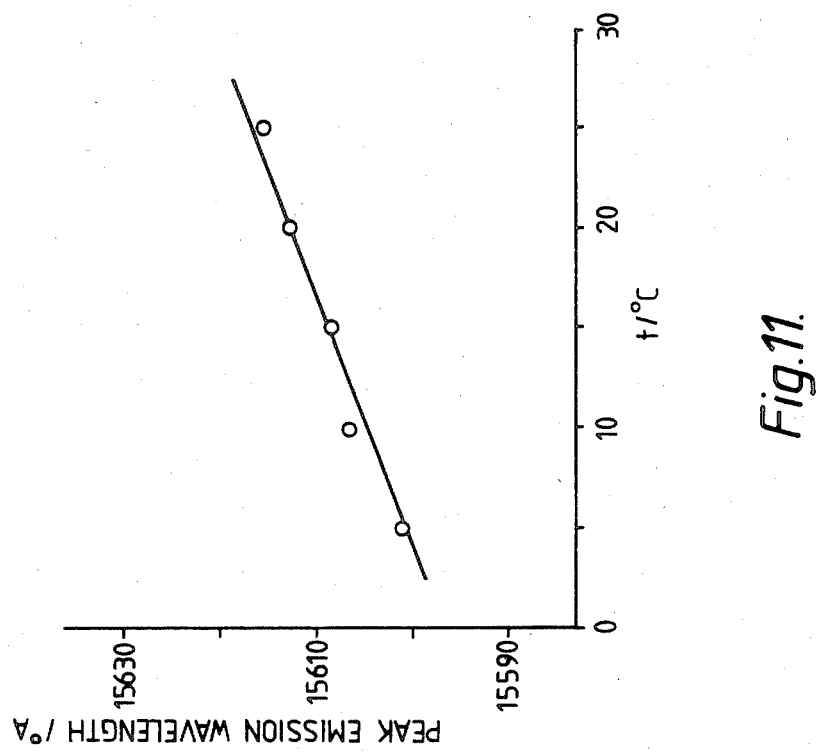
FIG. 11 is a plot of peak emission wavelength against temperature for the DFB laser.
Figure 10:
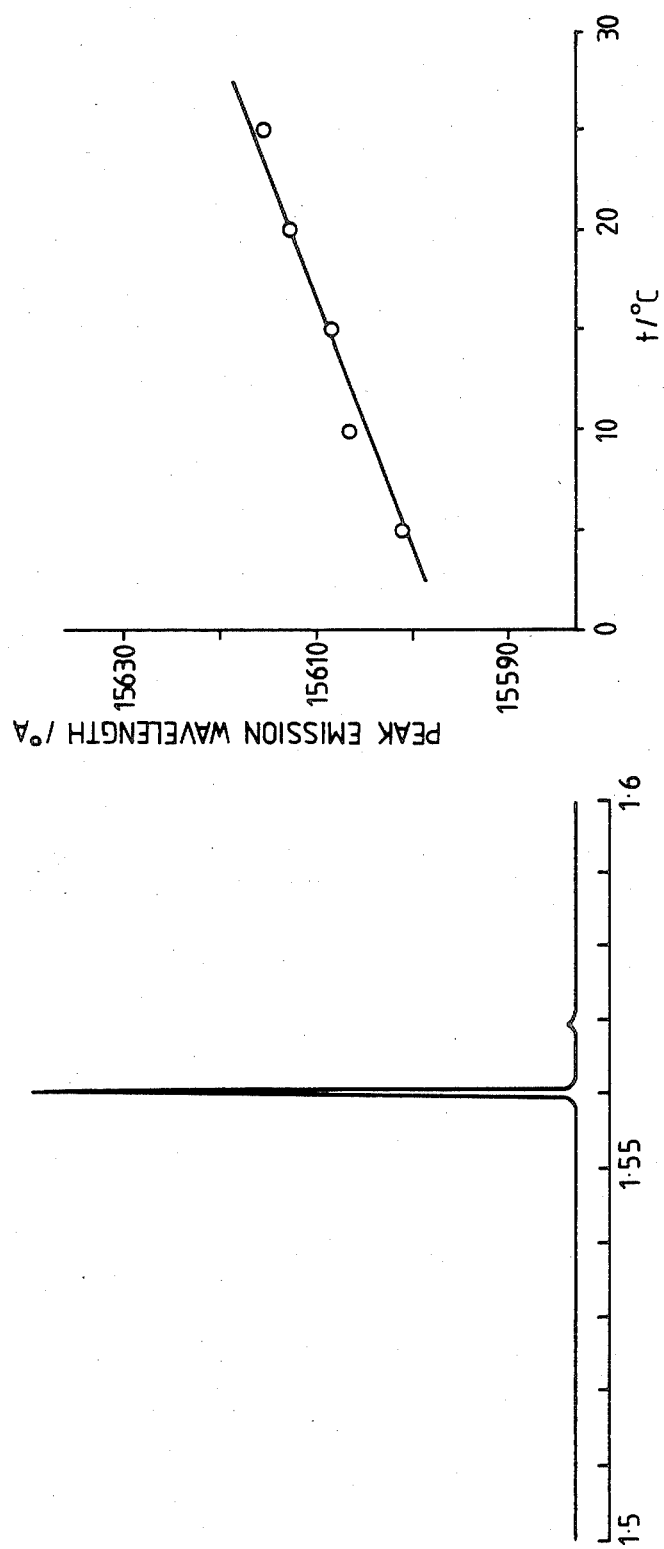
FIG. 10 is a plot of light output against wavelength for the DFB laser.

It was found that at temperature between 5° and 25° C. the spectral output of the DFB laser was almost entirely contained in a single longitudinal mode near to 1.56 μm. A typical spectrum is shown in FIG. 10. A more detailed study showed that the emission linewidth was less than the minimum resolution of our monochromator (0.3 μm or 3 Å). The variation of the peak emission wavelength with temperature is shown in FIG. 11. The solid line represents a best-fit to the data and corresponds to a temperature coefficient of 0.08 nm/°C. or 0.8 Å/°C.

Figure 5:
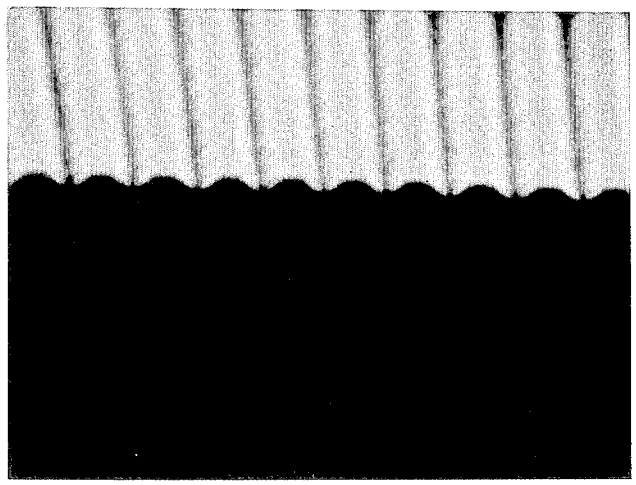
FIGS. 5, 6 and 7 are SEM photographs of shaped semiconductor surfaces exposed to phosphine under varying temperature conditions and demonstrating that phosphine is the substance primarily responsible for potential deformation of such shaped surfaces.
Figure 6:
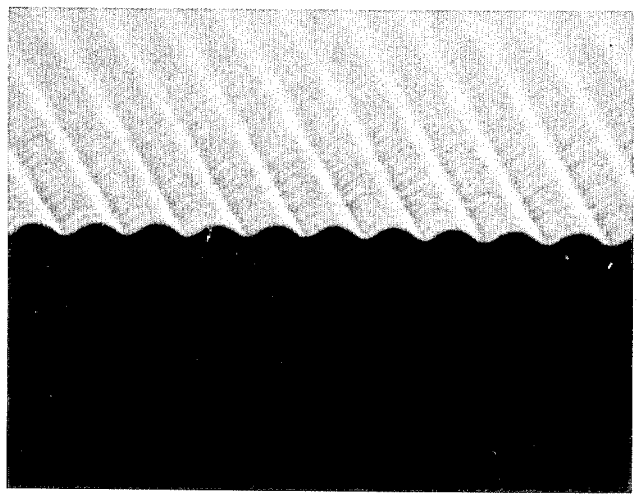
Figure 7:
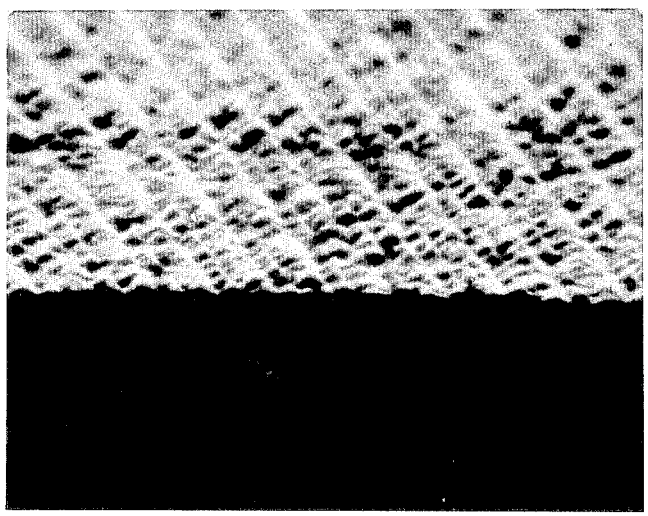

Experiments were performed on the material transport phenomenon involving $In_{0.74}Ga_{0.26}As_{0.57}P_{0.43}$ in the presence of $PH_3$, and in particular on the temperature dependence of this phenomenon, and these experiments will now be described with reference to:

FIGS. 5, 6 and 7 each of which is an SEM photograph of a corrugated $In_{0.74}Ga_{0.36}As_{0.57}P_{0.43}$ surface that has been exposed to $PH_3$ under particular conditions.

The experiments were performed by heating the corrugated sample in an atmosphere of 0.6 volume percent $PH_3$ in $H_2$ from room temperature to a temperature t in 30-40 seconds, holding temperature t for 60 seconds, and then cooling the sample to 450° C. within 60 seconds. The values of t for FIGS. 5 to 7 were as follows:

FIG. 5—550° C.
FIG. 6—650° C.
FIG. 7—750° C.

Some destruction of the surface is evident in FIG. 6 and almost complete destruction in FIG. 7.

A comparative experiment with pure $H_2$ at 650° C. led to no surface deformation. This experiment indicates the importance of $PH_3$ for surface deformation.

It will be appreciated that simple trial-and-error experiments along these general lines can be used by the man skilled in the art to guide him in the performance of the invention in any given materials or experimental system.

In the case of growth on InP, the results reported by Z. L. Lia u and J. N. Walpole, Appl. Phys. Lett., volume 40, pages 568-570 (1982) may be of assistance.

The experiments may be relevant also to ambient conditions prevalent prior to LPE overgrowth, where the corrugated surface is commonly protected by an InP "cover" slice which is used to generate an overpressure of phosphorus containing gases in an attempt to prevent thermal dissociation of the substrate. It may be that a significant proportion of the corrugation deformation that occurs during the LPE growth process takes place prior to growth. It may be also that deformation can be utilized to achieve specific effects.

In the earlier part of this specification we have referred to three adverse reactions. We will now summarize these reactions.

In-plating

This reaction comprises the decomposition of the organo-metallic compound eg:

$In(CH_3)_3$ or

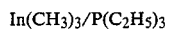

$In(CH_3)_3/P(C_2H_5)_3$ to indium. If the indium deposits on the substrate an unsatisfactory product will result.

The In-plating reaction is not significant below 200° C. nor above 500° C. in the presence of phosphine because of phosphide formation. It is significant in the temperature range 200° C. to 500° C. and it would become fast above 500° C. in the absence of phosphine.

P-Loss

It appears that unsatisfactory products may result from chemical decomposition of the top layer, especially loss of phosphorus. This reaction probably plays no part below 500° C. and it may become faster above 600° C. There is good evidence that this reaction is suppressed by the presence of phosphine.

Transport

As explained above, it appears that the top layer re-distributes itself in the presence of phosphine. The re-distribution occurs above 500° C., especially above 530° C., and it becomes very fast above 600° C. It is probable that this mechanism occurs even on a flat surface but is not noticeable and it does not give rise to detectable effects. We were surprised to encounter the reaction in MOCVD systems and we were also surprised by its very high speed, especially at temperatures above 600° C. We were also surprised by the apparent efficacy of even small amounts of overgrowth in reducing, even eliminating, the transport reaction.

It is the primary object of this invention to achieve overgrowth onto a shaped substrate, e.g., a grating, without causing unacceptable damage to the profile. We have found that MOCVD is capable of achieving this object and we have also, surprisingly, found that most, if not all, the damage occurs during the heating phase which takes place immediately before the growth reaction starts, i.e., during the initiation. In addition we have, most surprisingly, found that no substantial further damage occurs during the overgrowth reaction, especially when using a relatively high concentration of the organo-indium compound whereby the overgrowth reaction is fast.

It will also be appreciated that the damage potential is strongly temperature dependent, i.e., the damage potential becomes worse as the temperature rises.

At temperatures above 600° C., the damage potential is extreme and probably unacceptable. However, in the presence of all reactants, growth occurs at these temperatures (600° C. to 700° C. being the preferred growth temperature) and we have observed that, for all practical purposes, the growth reaction suppresses the adverse reactions. We do not know the mechanism for this suppression but we believe that even a very slight overgrowth, formed in a few seconds, may provide adequate protection. Thus it is important to avoid prolonged exposure of the substrate to temperatures above 600° C. except in the presence of all reactants needed to support the growth reaction. We advise that said reactants should be added not later than 20 seconds after 600° C. is first reached and, preferably, not later than the time at which 600° C. is first reached. We also advise using a relatively high concentration of organo-indium compound to give a fast overgrowth.

At temperatures in the range 500° C. to 600° C. the damage potential is substantial but all the reactions are slower than at temperatures above 600° C. It is possible that adverse reactions may occur even in the presence of all the reactants needed for growth and we recommend avoiding prolonged exposure to temperatures in the range 500° C. to 600° C., e.g., by starting the growth reaction within one minute, preferably within 40 seconds, of the temperature first reaching 500° C. This usually involves adding any missing reactants and achieving 600° C. within one minute, preferably 40 seconds, of the temperature first reaching 500° C.

At temperatures in the range 200° C. to 500° C. the damage potential is only slight. The adverse reactions of transport and phosphorus loss are slow in this range and they do not play an important part on any practical time scale. This leaves the indium plating reaction to be considered. It will be apparent that no indium plating is possible in the absence of indium compounds and by first adding the indium compound at a temperature above 500° C. no plating can occur at low temperature. Plating is a possibility when the organo-metallic compound is added above 500° C. but the prior addition of phosphine is effective to suppress the plating reaction at temperatures above about 500° C. The plating reaction tends to be slow at temperatures in the range 200° C.–500° C. and, even in the presence of the organo-metallic, it can be kept at an acceptably low level by a short exposure time, e.g., achieving 600° C. and/or growth reaction temperature in not more than three minutes, preferably not more than 40 seconds, after 200° C. is achieved.

At temperatures below 200° C. the damage potential is minimal or non-existent. The preliminaries, e.g., flushing with hydrogen to remove air from the reaction vessel, can be conducted at ambient temperature (usually about 10° C. to 40° C., e.g., about 30° C., in most laboratories) without danger.

We will now provide three further examples, i.e., Examples 4, 5 and 6. Each of these examples uses a substrate as identified in Example 1 and overgrowth is described. In particular, the initiation of the overgrowth reaction is described.

The procedure was carried out in conventional MOCVD apparatus which comprised a reaction chamber containing a graphite block to support the substrate with its shaped surface uppermost. The apparatus included means for supplying gas-phase reagents into the reaction chamber so that the substrate is exposed to reaction mixture.

The heating-means took the form of a coil surrounding the reaction chamber. Passage of RF-frequency current through the coil induced eddy currents in the graphite block causing the block to become hot whereby the substrate is heated by conduction. The temperatures quoted in the examples are the temperatures of the substrate itself.

In each of Examples 4, 5 and 6 the preliminaries comprised placing the substrate on the graphite block and flushing with hydrogen for 20 to 30 minutes at 30° C. The purpose of flushing was to displace the air. The pressure of hydrogen was about atmospheric and the flow rate was 0.2 to 0.3 moles/min. This flow was maintained until the substrate had cooled after the end of the growth reaction.

Example 4

After preliminaries as defined the procedure comprised as follows:

Stage A

The flow of phosphine was started at 30° C., i.e., at the temperature of hydrogen flushing. The flow rate was maintained at $1 \times 10^{-3}$ moles/minute until terminated as specified in stage F.

Stage B

After Stage A had continued for two minutes, the temperature of the substrate was raised from 30° C. to 450° C. in 30 seconds.

Stage C

The temperature was held at 450° C. for 30 seconds. The purpose of the hold was to achieve thermal equilibrium and to reduce the danger of overshooting the growth temperature.

Stage D

Heat from 450° C. to 650° C. in 20 seconds.

Stage E

In(CH₃)₃ was introduced at 600° C. The flow rate was 5×10⁻⁵ moles/min and this flow rate was maintained until as specified in Stage F. It will be noted that Stage E was performed about 5 seconds before the end of Stage D. Stage E marks the end of the initiation period.

Stage F

The overgrowth was grown at 650° C. for 12 minutes. At the end of this period the flow of reagents was terminated and the substrate allowed to cool to 30° C. in hydrogen and phosphine.

The performance of the overgrown product indicated that there was little or no deformation of the grating.

It should be noted:

(I) Indium plating was not possible below 600° C. because of the absence of indium compounds.

(II) Phosphorus loss was controlled by the presence of phosphine throughout the initiation.

(III) Transport was held to an acceptable level because growth probably started at 600° C. when the In(CH₃)₃ was added. That is about 10 seconds after 500° C. was first reached.

(IV) There was little possibility of an adverse reaction during the "hold" at 450° C. in the absence of indium.

(V) The whole initiation took just over one minute.

(VI) The flow specified in Stage E (5×10⁻⁵ moles/min) gave overgrowth at about 0.1 μm/min thickness. It is surprising that this growth rate gave a satisfactory result which implies that the transport reaction was suppressed.

Example 5

After preliminaries as defined the procedure comprised the following stages.

Stage A

As Example 4.

Stage B

The temperature was raised from 30° C. to 150° C. in 30 seconds.

Stage C

The temperature was held at 150° C. (to reduce the danger of overshooting the growth temperature). Adverse reactions are unlikely at 150° C.

Stage D

The In(CH₃)₃ was introduced at 150° C. using the flow rate of Example 4 until termination in Stage F.

Stage E

The temperature was raised from 150° C. to 650° C. in 50 seconds.

Stage F

As for Example 4.

The performance of the product indicated that there was little or no degradation of the grating.

In this example the control of adverse reactions was achieved by the short time, about 40 seconds, from 200° C. to initiation (which probably occurred at about 600° C.) and the high speed of the growth reaction.

There was a possibility of indium plating between 200° C. and 500° C. but the transition time (30 seconds) was too short for the damage potential to become actual.

Example 6

After preliminaries as defined, the temperature was raised from 30° C. to 650° C. in about 60 seconds and both reactants were added, with the flow rates specified in Example 5, at 600° C. Growth was carried out as specified in Stage F of Example 5.

The control of the adverse reactions was achieved by (I) the speed of the initiation, (II) late addition of the reactants, and (III) the high rate of the growth reaction.

A satisfactory product was achieved.

In Examples 4, 5 and 6 the In(CH₃)₃ was used at a concentration of 5×10⁻⁵ moles/min. This caused the overgrowth to form at a rate of about 0.1 μm/min. Over the operable range the growth rate is approximately proportional to the concentration of the In(CH₃)₃.

What is claimed is:

1. A method of depositing a further semiconductor layer onto a shaped surface of a different semiconductor substrate, said shaped surface including a diffraction grating, wherein both substrate and grown material comprise indium and phosphorus, in which method the same further layer is grown from a gas mixture containing a phosphorous-compound and an organo-indium compound capable of reaction to grow said further layer by MOCVD, wherein initiation comprises heating the substrate from a temperature below the temperature at which substantial transport of the substrate occurs to the reaction temperature at which deposition growth of the substrate occurs, said growth being initiated less than 1 minute after the transport temperature is first reached.

2. A method according to claim 1, in which the phosphorus compound is phosphine.

3. A method according to either claim 1 or claim 2 in which the organo indium compound has the general formula (I), (II) or (III):

$$R_1R_2R_3InXR_4R_5R_6 \quad (I)$$

$$R_1R_2InXR_4R_5 \quad (II)$$

$$InR_1R_2R_3 \quad (III)$$

in which $R_1$ to $R_6$ are alkyl groups, any two of which may be the same or different, and X is an atom which has an $s^2p^3$ outer electron configuration.

4. A method according to claim 3, in which the organo indium compound is selected from:

$$IN(CH_3)_3$$

and $$(CH_3)_3InP(C_2H_5)_3.$$

5. A method according to claim 1 wherein the shaped surface in a diffraction grating.

6. A method according to claim 5, wherein the grating is suitable for achieving distributed feedback at a frequency corresponding to a wavelength in vacuo in the range from 1.1 μm to 1.65 μm.

7. A method according to claim 6, wherein the same wavelength is in the range from 1.4 μm to 1.65 μm.

8. A method according to claim 1 wherein the phosphorus compound is provided about the substrate at a temperature below that at which material transport would occur and growth initiation comprises heating the substrate to a temperature at which growth occurs.

9. A method according to claim 1 wherein the semiconductor substrate is a gallium indium arsenide phosphide and the semiconductor material grown is indium phosphide.

10. A method of producing a distributed feedback laser which comprises the steps of:
 (i) growing in sequential face contact a first waveguide semiconductor layer, an active semiconductor layer, and a second waveguide semiconductor layer,
 (ii) forming distributed feedback corrugations in the surface of the second waveguide layer remote from the active layer, and
 (iii) depositing a further semiconductor layer on the corrugations by a method according to claim 1.

11. A method according to claim 10, wherein the grating is suitable for achieving distributed feedback at a frequency corresponding to a wavelength in vacuo in the range from 1.1 μm and 1.65 μm.

12. A method according to claim 11, wherein the second waveguide layer is a gallium indium arsenide phosphide and the said further layer is indium phosphide.

13. A method according to claim 8 wherein the substrate is initially contacted with a mixture of phosphorus compound and organo-indium compound whereby said raising of the temperature initiates growth.

14. A method according to claim 8 wherein the substrate is initially contacted with phosphorus compound and the organo-indium compound is admitted after the substrate has reached transport temperature.

15. A method according to claim 14, wherein the organo-indium compound is admitted not later than 20 seconds after the growth temperature is achieved.

16. A method of depositing a further semiconductor layer onto a shaped surface of a different semiconductor substrate, said shaped surface including a diffraction grating, wherein both substrate and grown material comprise indium and phosphorus, in which method the said further layer is grown from a gas mixture containing a phosphorus compound and an organo-indium compound capable of reaction to grow said further layer by MOCVD, wherein initiation comprises:
 (a) heating the substrate from a temperature below 500° C. to a reaction temperature above 575° C.;
 (b) reaching said reaction temperature less than one minute after 500° C. is first reached;
 (c) adding the organometallic reagent before said reaction temperature is reached; and
 (d) adding the phosphine not later than the organometallic reagent.

17. A method according to claim 16 wherein said reaction temperature is reached not later than 40 seconds after 500° C. is first reached.

18. A method according to either claim 16 or claim 17 wherein the phosphorus compound is first provided about the substrate at a temperature below 500° C. and the organo-indium reagent is first provided about the substrate at a temperature above 500° C.

19. A method according to either claim 16 or claim 17 wherein the substrate is contacted substantially simultaneously with the phosphorus compound and the organo-indium compound said simultaneous contact occurring at a temperature above 500° C.

20. A method of depositing a further semiconductor layer onto a shaped surface of a different semiconductor substrate, said shaped surface including a diffraction grating, wherein both substrate and grown material comprises indium and phosphorus, in which method the said further layer is grown from a gas mixture containing a phosphorus compound and an organo-indium compound capable of reaction to grow said further layer by MOCVD, wherein initiation comprises:
 (a) heating the substrate from a temperature below 200° C. to a reaction temperature above 575° C.;
 (b) reaching said reaction temperature less than one minute after 500° C. is first reached;
 (c) adding the organo-indium compound after 500° C. has been reached and before said reaction temperature is reached; and
 (d) adding the phosphorus compound not later than the organo-indium compound.

21. A method according to claim 20, in which the reaction temperature is reached not later than three minutes after 200° C. is first reached.

22. A method according to either claim 20 or claim 21, in which the reaction temperature is reached not less than 40 seconds after 500° C. is first reached.

23. A method according to claim 22 in which 600° C. is reached not later than 40 seconds after the temperature first reaches 500° C.

24. A method of depositing a further semiconductor layer onto a shaped surface of a different semiconductor substrate, said shaped surface surface including a diffraction grating, wherein both substrate and grown material comprise indium and phosphorus, in which method the said further layer is grown from a gas mixture containing a phosphorus compound and an organ-indium compound capable of reaction to grow said further layer by MOCVD, wherein initiation comprises:
 (a) heating the substrate from a temperature below 500° C. to a reaction temperature in the range of 600° C. to 700° C.;
 (b) reaching 600° C. less than one minute after 500° C. is first reached;
 (c) adding the organo-indium compound not substantially before 500° C. has been reached and not substantially after 600° C. has been reached; and
 (d) adding the phosphorus compound not latter than the organo-indium compound.

25. A method according to claim 24, which also comprises preliminary flushing with hydrogen at a flushing temperature below 200° C. to displace oxygen from about the substrate and thereafter initiating growth as specified in claim 24.

26. A method according to claim 25, in which the flushing is carried out at ambient temperature.

27. A method according to either claim 24 or claim 25, in which 600° C. is reached not later than one minute after the temperature is first raised from the flushing temperature.

28. A method according to any one of claims 24 to 26 in which 600° C. is reached not later than 40 seconds after the temperature first reaches 500° C.

29. A method according to claim 27 in which 600° C. is reached not later than 40 seconds after the temperature first reaches 500° C.

30. A method according to claims 25 or 26, in which the phosphorus compound is added at the flushing temperature.

31. A method according to claim 27 in which the phosphorus compound is added at the flushing temperature.

32. A method according to claim 27 in which the phosphorus compound is added at substantially the same time as the organo-indium reagent.

33. A method according to claim 28 in which the phosphorus compound is added at substantially the same time as the organo-indium reagent.

34. A method of growing a semiconductor material onto a shaped surface of a different semiconductor substrate, said shaped surface including a diffraction grating, wherein both substrate and growth material comprise indium and phosphorus, in which method the said material is grown from a gas mixture containing phosphine and a compound of the general formula (I), (II) or (III):

$$R_1R_2R_3InXR_4R_5R_6 \quad (I)$$

$$R_1R_2InXR_4R_5 \quad (II)$$

$$InR_1R_2R_3 \quad (III)$$

in which $R_1$ to $R_6$ are alkyl groups, any two of which may be the same or different, and X is an atom which has an $s^2p^3$ outer electron configuration, wherein the exposure of the substrate to phosphine is controlled to less than one minute to avoid or reduce transport of the substrate material aand to substantially avoid deformation of said shaped surface, while exposing the substrate to temperatures at which transport of the substrate would otherwise occur.

35. A method of growing a semiconductor material onto the shaped corrugated surface of a different semiconductor substrate during the manufacture of a solid state semiconductor device wherein both the shaped corrugated substrate and the material to be grown comprise indium and phosphorus, said method comprising:
growing the said material by MOCVD from a gas mixture containing phosphine and an organo-indium compound, and
substantially avoiding prolonged exposure of the shaped substrate to temperatures which are between that required for material transport of said shaped surface in the presence of phosphine and that required to support substantial growth of said material so as to substantially reduce transport of the substrate material and thereby substantially avoid deformation of said shaped corrugated surface within the device, said exposure being limited to less than one minute.

36. A method according to claim 35 wherein the phosphine gas is initially provided about the substrate at a temperature below that at which material transport occurs and wherein growth initiation of said material is thereafter induced by heating the substrate to a temperature at which growth occurs.

37. A method according to claim 36 wherein the substrate is initially contacted with a mixture of phosphine and organo-indium compound whereby said raising of the temperature initiates growth.

38. A method according to claim 36 wherein the substrate is initially contacted with phosphine and a organo-indium compound is admitted for contact only after the substrate has reached growth temperature.

39. A method according to claim 38 wherein the organo-indium compound is admitted within 20 seconds after growth temperature is achieved.

40. A method of depositing a further semiconductor layer onto the shaped surface of another semiconductor substrate wherein both substrate and grown material comprises indium and phosphorus, in which method the further layer is grown by MOCVD from a gas mixture containing a phosphorus compound and an organo-indium compound, wherein initiation of a MOCVD growth process comprises heating the substrate from a temperature below the temperature required for material transport of said shaped surface in the presence of phosphine to the temperature required to support substantial growth of said material, said growth being initiated less than one minute after the transport temperature is first reached.

41. A method of growing by MOCVD a layer of phosphorus containing semiconductor material onto the shaped surface of another phosphorus-containing semiconductor substrate without substantial deformation of the shaped surface, said method comprising the steps of:
heating said semiconductor substrate form a first temperature below that at which material transport of said shaped surface occurs to a second temperature at which MOCVD growth can occur;
maintaining said substrate approximately at said second temperature for a predetermined growing period; and
passing a metal-organic vapor containing a Group III metal and a phosphorous-containing vapor onto said shaped surface so as to achieve MOCVD growth during said predetermined growing period;
said heating step being substantially completed and said passing step being started within a time period no greater than approximately one minute.

42. A method as in claim 41 wherein:
said substrate comprises In, Ga, As and P;
said metal-organic vapor comprises a compound of the general formula (I) or (II):

$$R_1R_2R_3InXR_4R_5R_6 \quad (I)$$

$$R_1R_2InXR_4R_5 \quad (II)$$

in which $R_1$ to $R_6$ are alkyl groups, any two of which may be the same or different and X is an atom which has an $s^2p^3$ outer electron configuration; and
said phosphorous-containing vapor comprises $PH_3$.

43. A method as in claim 41 or 42 wherein said phosphorous-containing vapor is passed onto said shaped surface during substantially all of said heating step.

44. A method as in claim 43 wherein said metal-organic vapor is also passed onto said shaped surface during substantially all of said heating step.

45. A method as in claim 43 wherein said metal-organic vapor is passed onto said shaped surface after said heating step but within no more than approximately 20 seconds after heating step is completed.

46. A method as in claim 41 wherein said first temperature is approximately 550° C. and said second temperature is approximately 630° C. or higher.

47. A method as in claim 41 wherein said metal-organic vapor includes an organo-indium compound and said phosphorous-containing vapor comprises $PH_3$.

48. A method as in claim 47 wherein said substrate comprises In, Ga, As and P.

49. A method as in claim 41, 42, 47 or 48 wherein said shaped surface comprises a diffraction grating intended to provide optical feedback in a semiconductor laser device.

50. A method as in claim 49 further comprising the step of constructing, by LPE, a lower optical waveguide layer, an active laser layer and an upper optical waveguide layer, which upper optical waveguide layer is then shaped into said diffraction grating to provide a DFB type laser structure.

* * * * *